(12) United States Patent
Ikeda

(10) Patent No.: US 7,558,096 B2
(45) Date of Patent: Jul. 7, 2009

(54) STACKED MEMORY

(75) Inventor: Hiroaki Ikeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 19 days.

(21) Appl. No.: 11/907,876

(22) Filed: Oct. 18, 2007

(65) Prior Publication Data

US 2008/0101104 A1    May 1, 2008

(30) Foreign Application Priority Data

Oct. 30, 2006    (JP)    .............................. 2006-294560

(51) Int. Cl.
*G11C 5/02* (2006.01)
*G11C 11/34* (2006.01)
*G11C 7/00* (2006.01)
*G11C 8/00* (2006.01)

(52) U.S. Cl. .............................. 365/51; 365/52; 365/63; 365/185.09; 365/200; 365/230.03

(58) Field of Classification Search ................... 365/51, 365/63, 185.09, 200, 230.03, 52; 714/763
See application file for complete search history.

(56) References Cited

U.S. PATENT DOCUMENTS

| | | | |
|---|---|---|---|
| 5,915,167 | A | 6/1999 | Leedy |
| 6,133,640 | A | 10/2000 | Leedy |
| 6,208,545 | B1 | 3/2001 | Leedy |
| 6,551,857 | B2 | 4/2003 | Leedy |
| 6,563,224 | B2 | 5/2003 | Leedy |
| 6,632,706 | B1 | 10/2003 | Leedy |
| 7,078,793 | B2 * | 7/2006 | Ruckerbauer et al. ......... 365/51 |
| 7,123,497 | B2 | 10/2006 | Matsui et al. |
| 7,138,295 | B2 | 11/2006 | Leedy |
| 7,193,239 | B2 | 3/2007 | Leedy |
| 7,200,021 | B2 * | 4/2007 | Raghuram ................... 365/51 |
| 7,203,886 | B2 * | 4/2007 | Brown et al. ................ 714/763 |
| 7,209,376 | B2 | 4/2007 | Saito et al. |
| 7,221,614 | B2 | 5/2007 | Saito et al. |
| 7,379,316 | B2 * | 5/2008 | Rajan .......................... 365/52 |
| 7,411,843 | B2 * | 8/2008 | Ruckerbauer et al. ......... 365/51 |
| 2002/0132465 | A1 | 9/2002 | Leedy |
| 2003/0057564 | A1 | 3/2003 | Leedy |
| 2003/0173608 | A1 | 9/2003 | Leedy |
| 2004/0007063 | A1 | 1/2004 | Tai et al. |
| 2004/0151043 | A1 | 8/2004 | Leedy |
| 2005/0286286 | A1 | 12/2005 | Saito et al. |
| 2006/0026258 | A1 | 2/2006 | Frank et al. |
| 2007/0117317 | A1 | 5/2007 | Ikeda et al. |
| 2007/0194455 | A1 | 8/2007 | Ikeda et al. |

FOREIGN PATENT DOCUMENTS

| | | |
|---|---|---|
| JP | 2002-516033 A | 5/2002 |
| JP | 2003-163326 A | 6/2003 |
| JP | 2004-327474 A | 11/2004 |
| JP | 2006-012337 A | 1/2006 |

(Continued)

*Primary Examiner*—Trong Phan
(74) *Attorney, Agent, or Firm*—Foley & Lardner LLP

(57) ABSTRACT

A stacked memory is configured such that a ratio between data and ECC bits, a ratio between quantities of data layers and ECC layers, and a ratio between quantities of data activated mats and ECC activated mats are equal to each other. The memory chip has a greater quantity of mats than the quantity of stacked layers. The stacked memory is thus allowed to establish a desired ratio between the quantities of data bits and ECC bits.

12 Claims, 12 Drawing Sheets

FOREIGN PATENT DOCUMENTS

| | | |
|---|---|---|
| JP | 2006-012358 A | 1/2006 |
| JP | 2006-013337 A | 1/2006 |
| JP | 2007-140948 A | 6/2007 |
| JP | 2007-226876 A | 9/2007 |

* cited by examiner

STACKED MEMORY

This application is based upon and claims the benefit of priority from Japanese patent application No. 2006-294560, filed on Oct. 30, 2006, the disclosure of which is incorporated herein in its entirety by reference.

BACKGROUND OF THE INVENTION

1. Field of the Invention

The present invention relates to a stacked memory having a plurality of stacked semiconductor chips, and particularly to a stacked memory having error checking and correcting (ECC) bits.

2. Description of the Related Art

Recently, configuration of semiconductor devices has been refined, and the capacity of semiconductor memories such as dynamic random access memories (DRAMs) and static random access memories (SRAMs) has been increased. On the other hand, the size of electronic equipment on which these semiconductor memories are mounted has been reduced. Therefore, the semiconductor memories have evolved as three-dimensional stacked memories having a plurality of stacked semiconductor chips while increasing the capacity thereof. The three-dimensional stacked memory has a plurality of stacked semiconductor chips, which are wire-bonded and packaged in a single package. Thus, the size of a large-capacity semiconductor device is reduced by stacking semiconductor chips to form a three-dimensional stacked memory.

Further, more recent development has led to a stacked memory using a through electrode instead of wire bonding for the purpose of realizing a semiconductor device with a further reduced size and increased operation speed. In such a stacked memory, stacked semiconductor chips are connected to each other by a through electrode formed through the semiconductor chips. It is expected that the usage of the through electrode reduces the space and inductance due to the wire bonding, and is able to achieve a semiconductor device having a further reduced size and a higher operating speed. The stacked memory can be configured as a memory module or memory system by stacking a plurality of memory chips. This stacked memory can be exemplified by a stacked DRAM having stacked DRAM chips.

A large-capacity memory system is configured to include an error checking and correcting bit (hereafter, referred to as the "ECC bit"). Any error is detected and corrected by this ECC bit to ensure data reliability. In a conventional memory module having an ECC bit, a monolithic memory is arranged planarly on a memory module substrate, and an additional data bus for the ECC bit is provided separately from a data bus. Therefore, the ratio between data bits and ECC bits can be changed easily by adding data buses as required.

In contrast, in the case of a stacked memory, a data bus is used commonly by a data bit and an ECC bit because memory chips are arranged three-dimensionally. In a three-dimensional configuration, the positions of through electrodes are common to all the memory chips. Therefore, a separate data bus cannot be provided for an ECC bit. If a separate data bus is provided for an ECC bit in a three-dimensional configuration, part of memory capacity will be wasted, impairing the effective use of the memory capacity. Accordingly, it becomes difficult for the stacked memory to change the ratio between data bits and ECC bits.

FIG. 1 is a configuration diagram showing a memory module having an ECC bit according to a related art in which a monolithic memory is arranged planarly, and FIG. 2 is a configuration diagram showing a stacked memory using a through electrode.

FIG. 1A shows a case in which the ratio between data bits and ECC bits is 8:1. A memory module 10 is comprised of nine semiconductor memories 1 in total: eight for data bits and one for an ECC. In this example, an eight-bit semiconductor memory is used as each semiconductor memory 1. The memory module is provided with 72-bit bus wiring in total, namely 64-bit (8 by 8) bus wiring for the data bits and eight-bit bus wiring for the ECC bit.

FIG. 1B shows a case in which the ratio between data bits and ECC bit is 4:1. The memory module 10 is comprised of often semiconductor memories 1 in total: eight for data bits and two for ECC bits. Each semiconductor memory 1 is formed by an eight-bit memory. The memory module is provided with 80-bit bus wiring in total, namely 64-bit (8 by 8) bus wiring for the data bits and 16-bit bus wiring for the ECC bits. In an existing memory module, a plurality of semiconductor memories are arranged, and a data wiring is provided for each of the semiconductor memories. A same address is input to the semiconductor memories, and data is input/output through each data wiring. A memory module having an ECC bit can be obtained by adding data wiring to a memory module substrate.

This memory module is configured as a stacked memory having stacked memory chips with through electrodes. When the ratio between data bits and ECC bits is 8:1 (FIG. 2A), the memory module is comprised of nine layers of memory chips 2 in total consisting of eight data layers 3 and one ECC layer 4. When the ratio between data bits and ECC bits is 4:1 (FIG. 2B), the memory module is comprised of ten layers of memory chips 2 in total consisting of eight data layers 3 and two ECC layers 4. In the stacked memory, the positions of the through electrodes are common to all the memory chips. Therefore, a memory bus for data and a memory bus for ECC bit are used in common. It is impossible to add a data bus as in the prior art. If an additional data bus is assigned for an ECC bit, a part of the memory capacity will be lost, impairing the effective use of the memory capacity. Consequently, there is a problem that it is difficult to configure a stacked memory having ECC bits or to change the ratio between data bits and ECC bits.

Stacked semiconductor devices having stacked semiconductor chips are described in patent documents as follows. Japanese Laid-Open Patent Publication No. 2006-13337 (Patent Document 1) relates to a technique in which one of a plurality of inter-chip wirings serving as signal transmission paths of a stacked semiconductor device is selected, while the other wirings are electrically disconnected. Japanese Laid-Open Patent Publication No. 2006-12358 (Patent Document 2) discloses a technique in which a memory cell array is provided with sub-banks corresponding to input/output bits, and inter-chip wirings are provided through memory chips so that the quantity of input bits is equal to that of output bits. Japanese Laid-Open Patent Publication No. 2006-12337 (Patent Document 3) discloses an interface chip having a bit configuration switching circuit for changing input and output bit configurations of memory chips.

Japanese Laid-Open Patent Publication No. 2004-327474 (Patent Document 4) relates to a technique in which a plurality of memory chips are stacked on an IO chip and connected by ways of through electrodes, and a system data signal and a data signal from the memory chip are converted by the IO chip. Japanese Laid-Open Patent Publication No. 2003-163326 (Patent Document 5) relates to a technique in which select wirings are provided for connecting a chip select signal terminal to chip select terminals of a plurality of semiconductor chips, and one of the semiconductor chips is selected by cutting the select wirings. Japanese Kohyo Patent Publication No. 2002-516033 (Patent Document 6) discloses a plurality of memory circuits and a single control circuit which are joined at a vertical junction. The patent documents mentioned above disclose a stacked semiconductor device having a switching circuit or fuse for switching signals. However, none of the patent documents recognizes the problems to be solved by the present invention, or implies or suggests a technique to solve the problems.

SUMMARY OF THE INVENTION

A stacked memory using through electrodes has already been developed in order to realize a large-capacity semiconductor device with reduced size and increased operation speed. However, since the positions of the through electrodes are common to all the memory chips in a stacked memory, it is impossible to provide a bus for ECC bit. Since a data memory bus and an ECC bit memory bus are used in common, it is impossible to provide a stacked memory using the memory capacity efficiently. Further, it is difficult to change the ratio between data bits and ECC bits.

In view of the problems described above, it is an object of the present invention to provide a stacked memory having a desired ratio of data bits and ECC bits by the use of memory chips having same configuration.

In order to solve the problems described above, the present invention basically employs the techniques as described below. It should be understood that various modifications and variation are possible without departing from the scope of the invention and all these modifications and variation are also included in the scope of the invention.

A stacked memory of the present invention is formed by stacking memory chips having through electrodes, wherein: a ratio between data bits and ECC bits, a ratio between a quantity of memory chip layers for data bits and a quantity of memory chip layers for ECC bits, and a ratio between a quantity of activated mats for data bits and a quantity of activated mats for ECC bits are set equal to each other; the stacked memory chips have a same chip configuration; and the quantity of mats of each memory chip is greater than the sum of the quantity of memory chip layers for data bits and the quantity of memory chip layers for ECC bits.

In the stacked memory of the present invention, a mat address bit designating a mat area including a plurality of mats to be activated for data bits is inverted to be a mat address for ECC bits, whereby a mat at a different position from those of the plurality of mats activated for the data bits is designated as a mat to be activated for ECC.

In the stacked memory of the present invention, the memory chip has a control system for each of the mats and the mats to operate can be designated individually.

A memory system of the present invention has an interposer, a hub, and a stacked memory mounted on a system board, wherein the stacked memory is composed of a plurality of stacked memory chips: a ratio between data bits and ECC bits, a ratio between a quantity of memory chip layers for data bits and a quantity of memory chip layers for ECC bits, and a ratio between a quantity of activated mats for data bits and a quantity of activated mats for ECC bits are set equal to each other; and the quantity of mats of each memory chip is greater than the sum of the quantity of memory chip layers for data bits and the quantity of memory chip layers for ECC bits.

In the memory system of the present invention, data exchanged between the stacked memory and the hub is arranged in a data row and ECC row which are input to and output from the hub.

In the memory system of the present invention, a mat address bit designating a mat area including a plurality of mats to be activated for data bits is inverted to be a mat address for ECC bits, whereby a mat at a different position from those of the plurality of mats activated for the data bits is designated as a mat to be activated for ECC.

In the memory system of the present invention, the memory chip has a control system for each of the mats and the mats to operate can be designated individually.

A stacked memory having ECC bits according to the present invention is configured such that a ratio between data bits and ECC bits, a ratio between a quantity of data layers and a quantity of ECC layers, and a ratio between a quantity of data activated mats and a quantity of ECC activated mats are equal to each other. A quantity of mats in the memory chip used herein is greater than the quantity of stacked layers. In the stacked memory of the present invention, the quantity of layers and the quantity of activated mats are determined according to the ratio between the data bits and ECC bits. Each memory chip used in the stacked memory of the present invention has a function capable of designating control for the mats individually, and a register capable of setting operation modes. A quantity of activated mats is set for the data layer memory chip by the register. The ECC layer memory chip converts a mat address to switch the ECC bit mat to the one at a position not competing with the data bit mat. In this manner, the stacked memory is configured such that operation of the layers and the mats can be controlled individually.

According to the configuration of the present invention, a desired ratio can be established between a quantity of data bits and a quantity of ECC bits by using memory chips having same configuration. A stacked memory having ECC bits can be obtained by stacking the memory chips according to the present invention.

DESCRIPTION OF THE PREFERRED EMBODIMENTS

A stacked memory according to the present invention will be described in detail with reference to FIGS. 3 to 12.

Figure 1A:
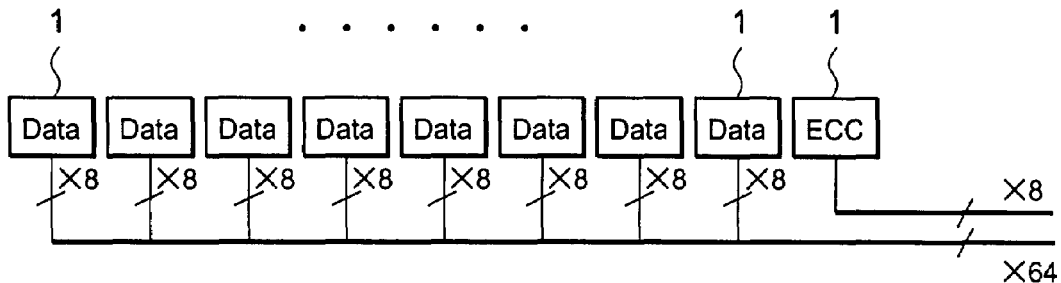
FIG. 1A is a configuration diagram showing a memory module according to a related art, having a ratio between data bits and ECC bits of 8:1.
Figure 1B:
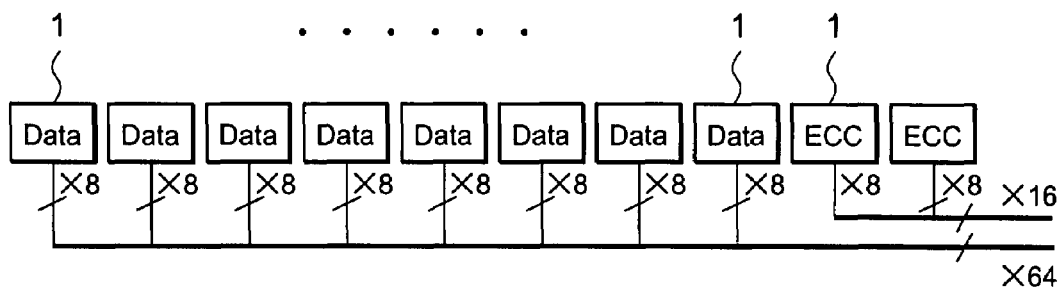
FIG. 1B is a configuration diagram showing a memory module according to a related art, having a ratio between data bits and ECC bits of 4:1.
Figure 2A:
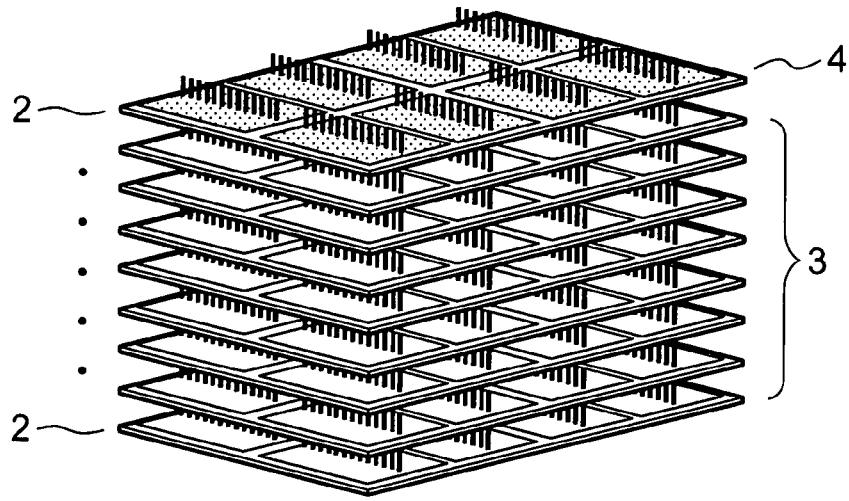
FIG. 2A is a configuration diagram showing a stacked memory according to a related art, having a ratio between data bits and ECC bits of 8:1.
Figure 2B:
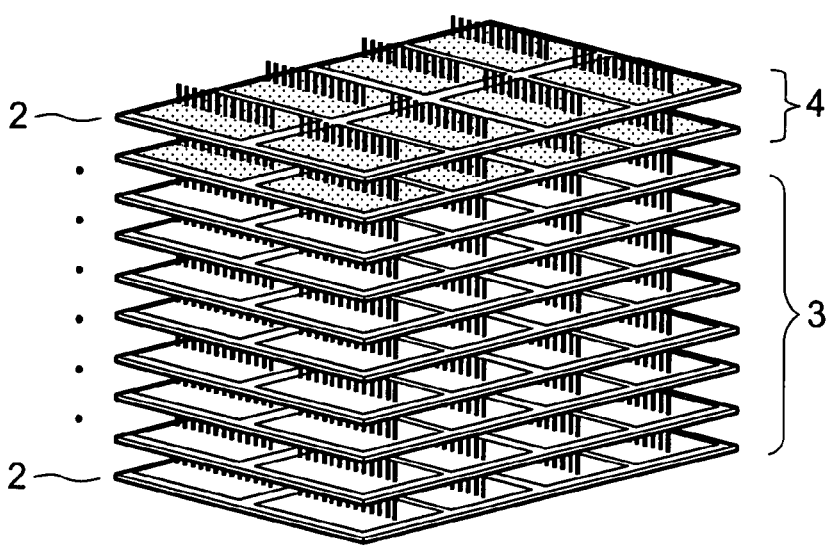
FIG. 2B is a configuration diagram showing a stacked memory according to a related art, having a ratio between data bits and ECC bits of 4:1.
Figure 3A:
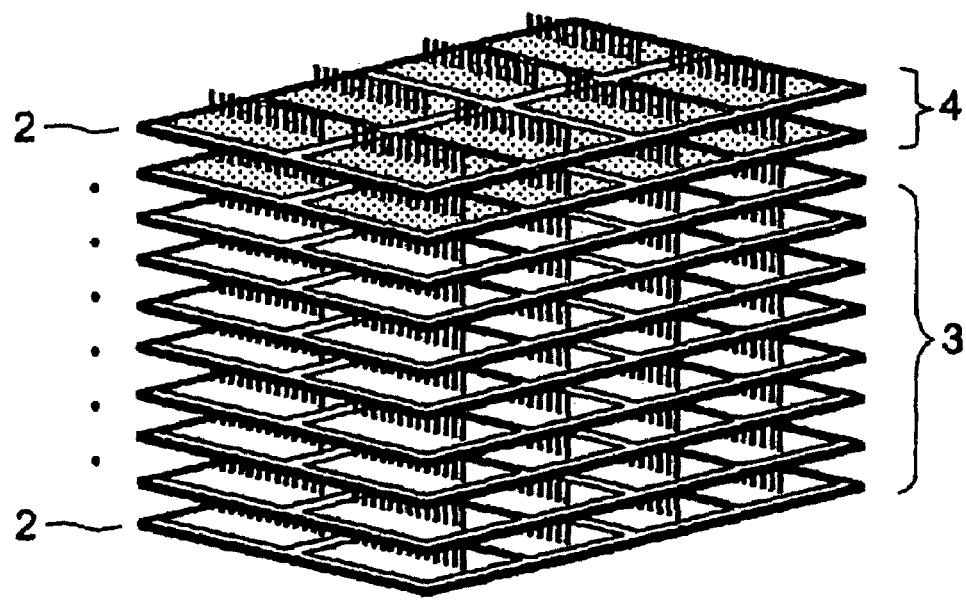
FIG. 3A is a configuration diagram showing a stacked memory according to the present invention, having a ratio between data bits and ECC bits of 4:1.
Figure 3B:
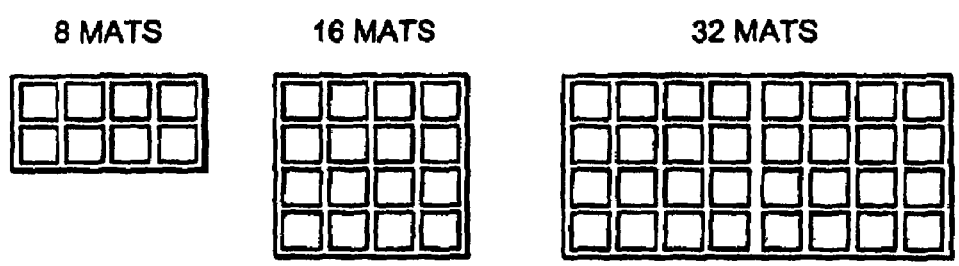
FIG. 3B is mat arrangement diagrams showing arrangement of memory chips in a stacked memory according to the present invention, having a ratio between data bits and ECC bits of 4:1.

FIG. 3A is a configuration diagram showing a stacked memory, and FIG. 3B is a diagram showing mat arrangement of memory chips. FIG. 4 is a mat arrangement diagram of a stacked memory using eight-mat memory chips. FIG. 5 is a mat arrangement diagram of a stacked memory using 16-mat memory chips. FIG. 6 is a diagram showing another mat arrangement of a stacked memory using 16-mat memory chips.

Figure 7:
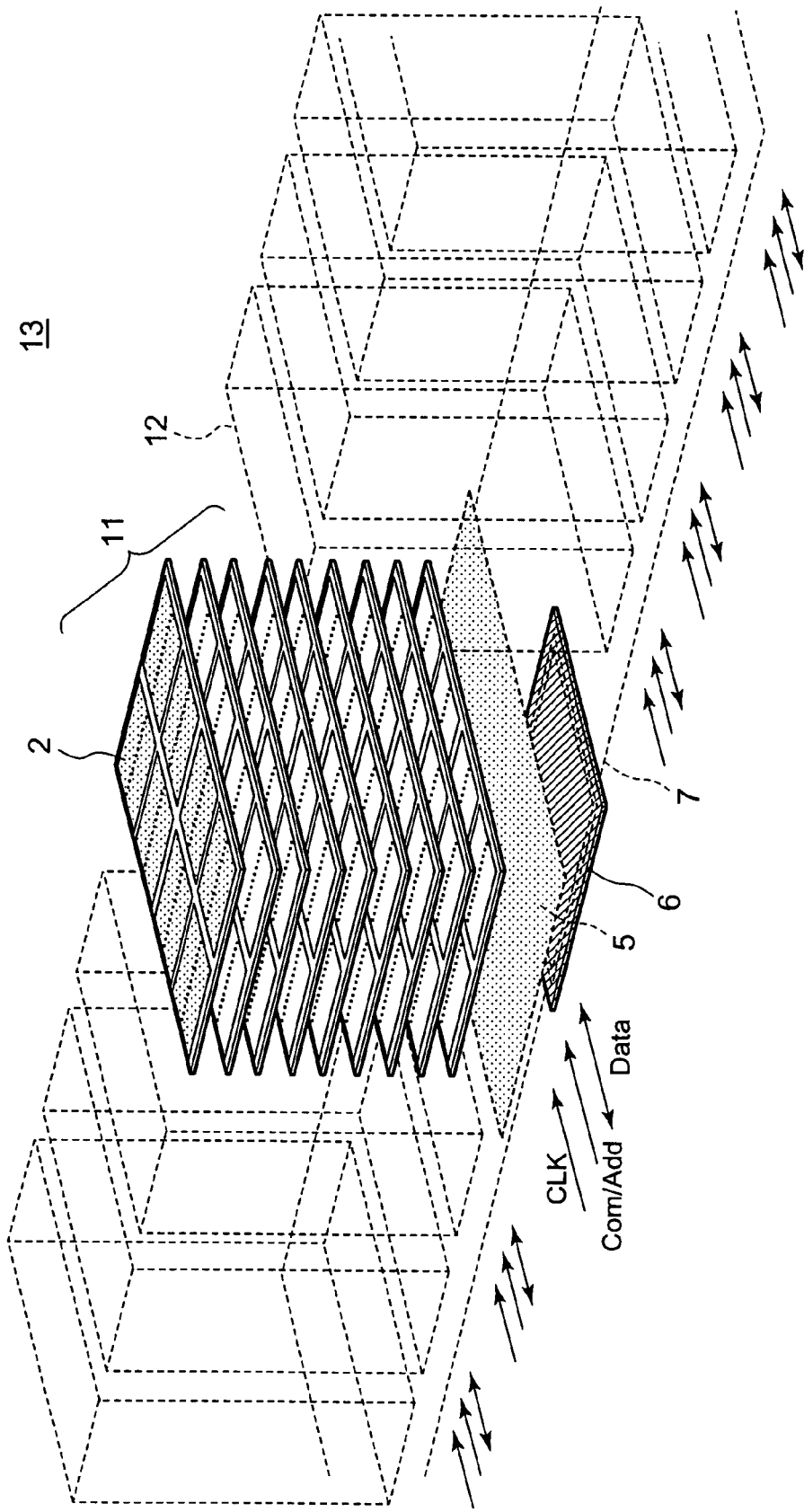
FIG. 7 is a configuration diagram of a memory system using stacked memories according to the present invention.
Figure 8:
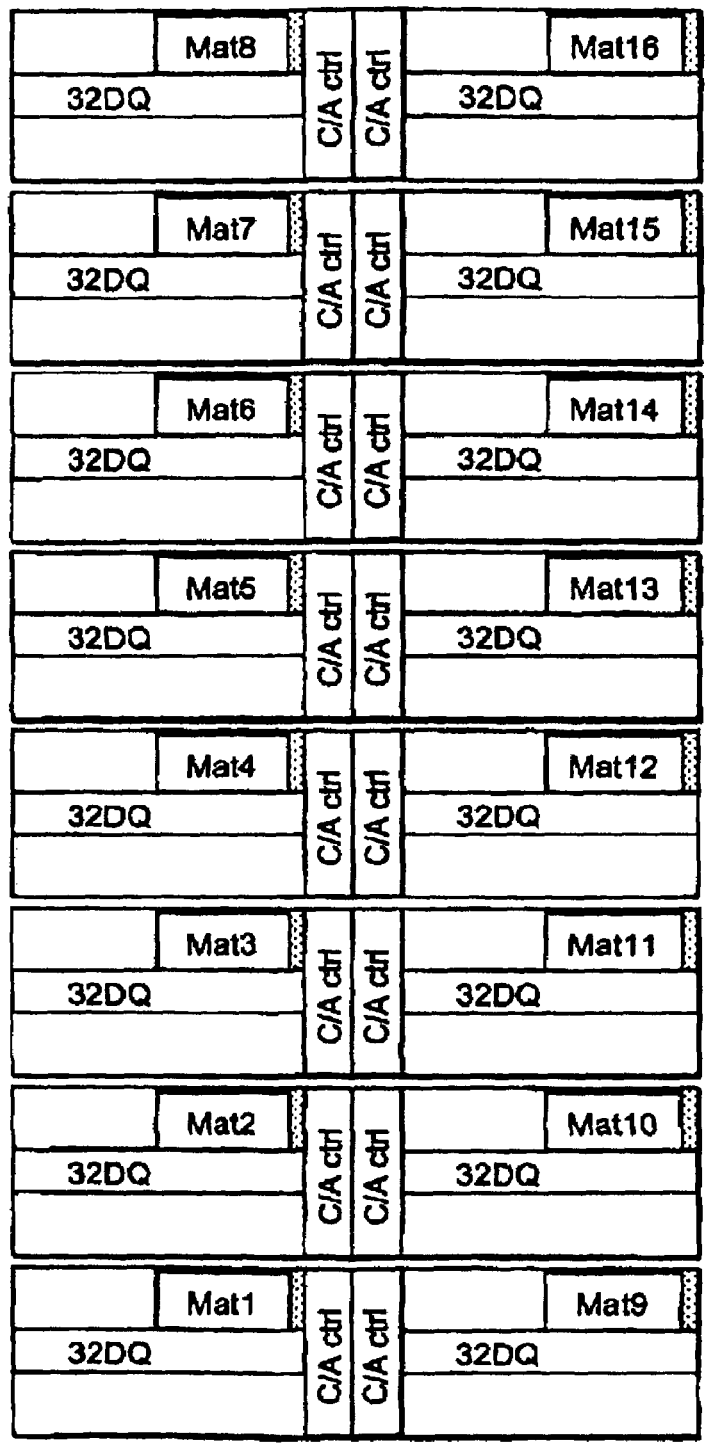
FIG. 8 is a layout diagram of memory chips according to the present invention.
Figure 9:
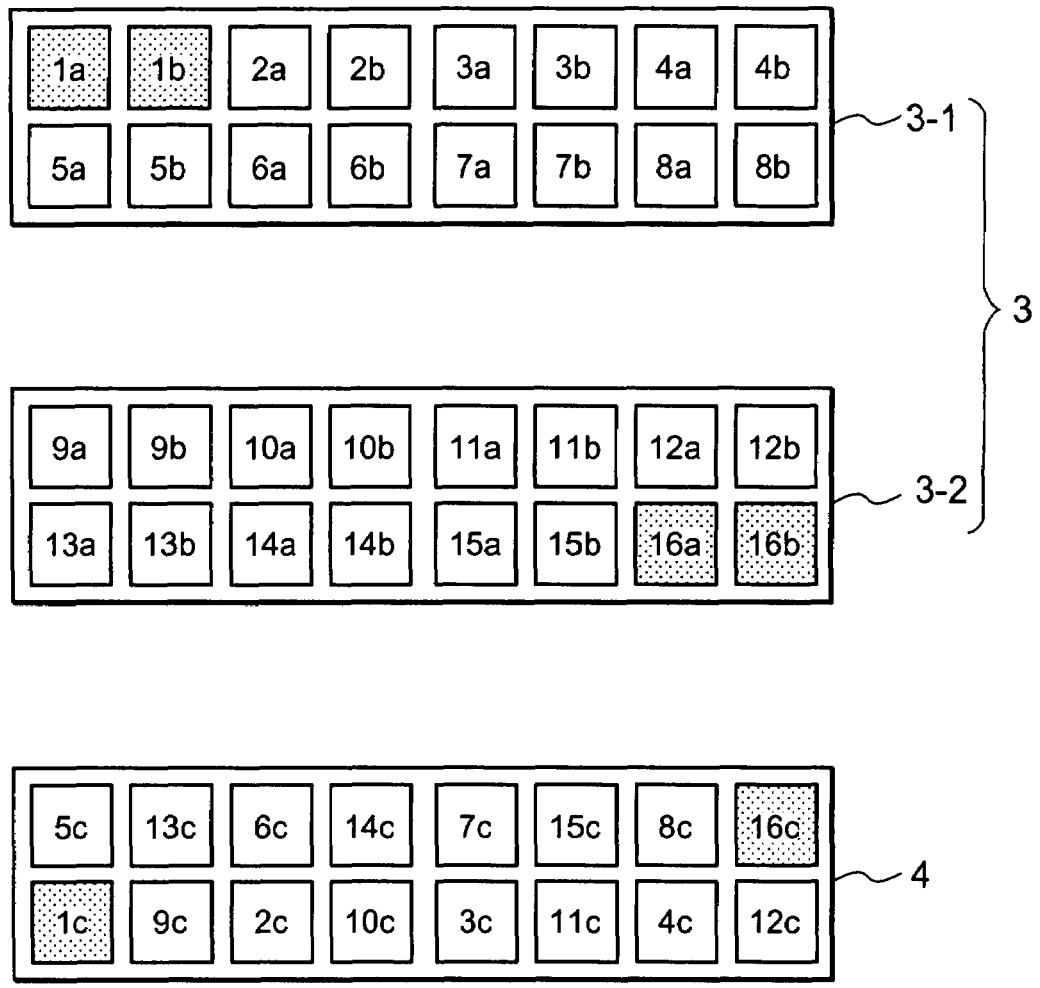
FIG. 9 is a mat arrangement diagram showing arrangement of 16-mat memory chips in a stacked memory according to the present invention, having a ratio between data bits and ECC bits of 2:1.
Figure 10A:
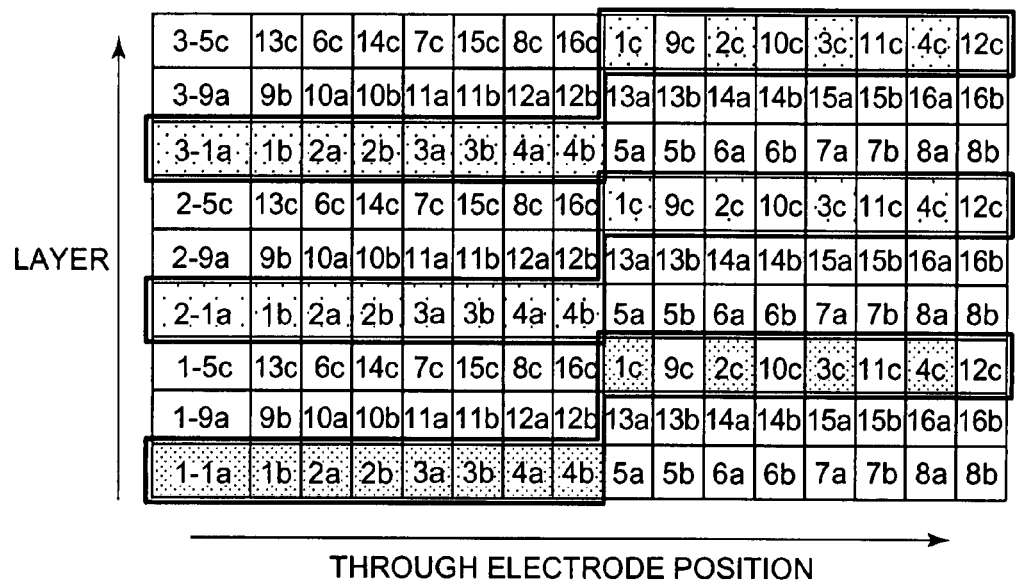
FIG. 10A is an explanatory diagram for explaining mat access according to positions of through electrodes in a stacked memory according to the present invention using 16-mat memory chips and having a ratio between data bits and ECC bits of 2:1.
Figure 10B:
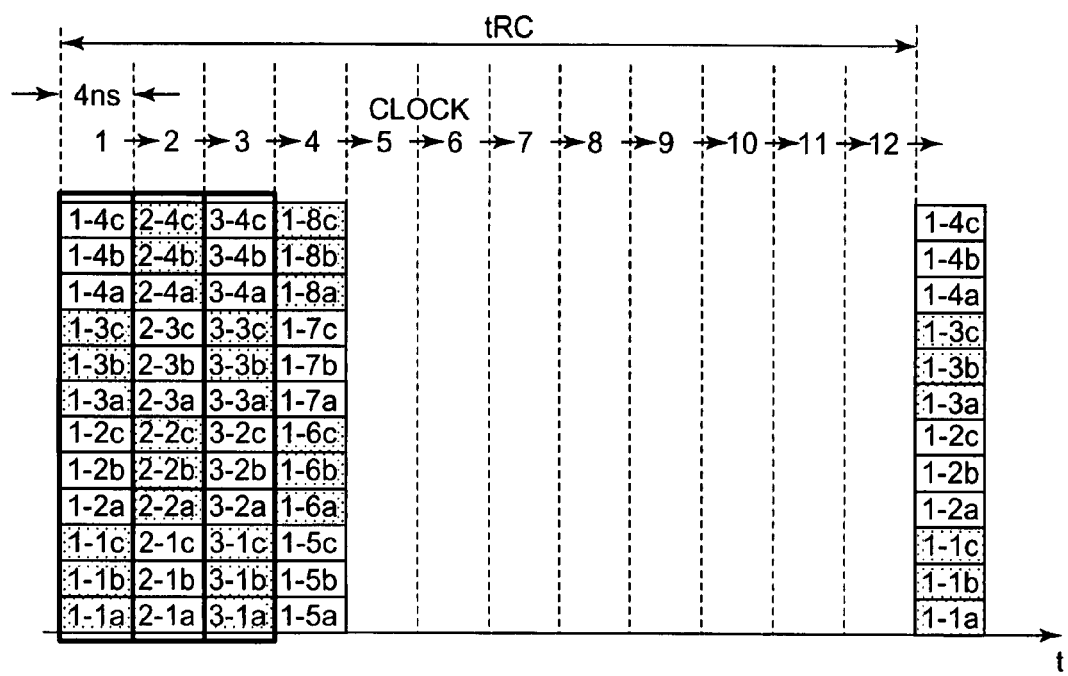
FIG. 10B is a time chart of mat access according positions of through electrodes in a stacked memory according to the present invention using 16-mat memory chips and having a ratio between data bits and ECC bits of 2:1.
Figure 11:
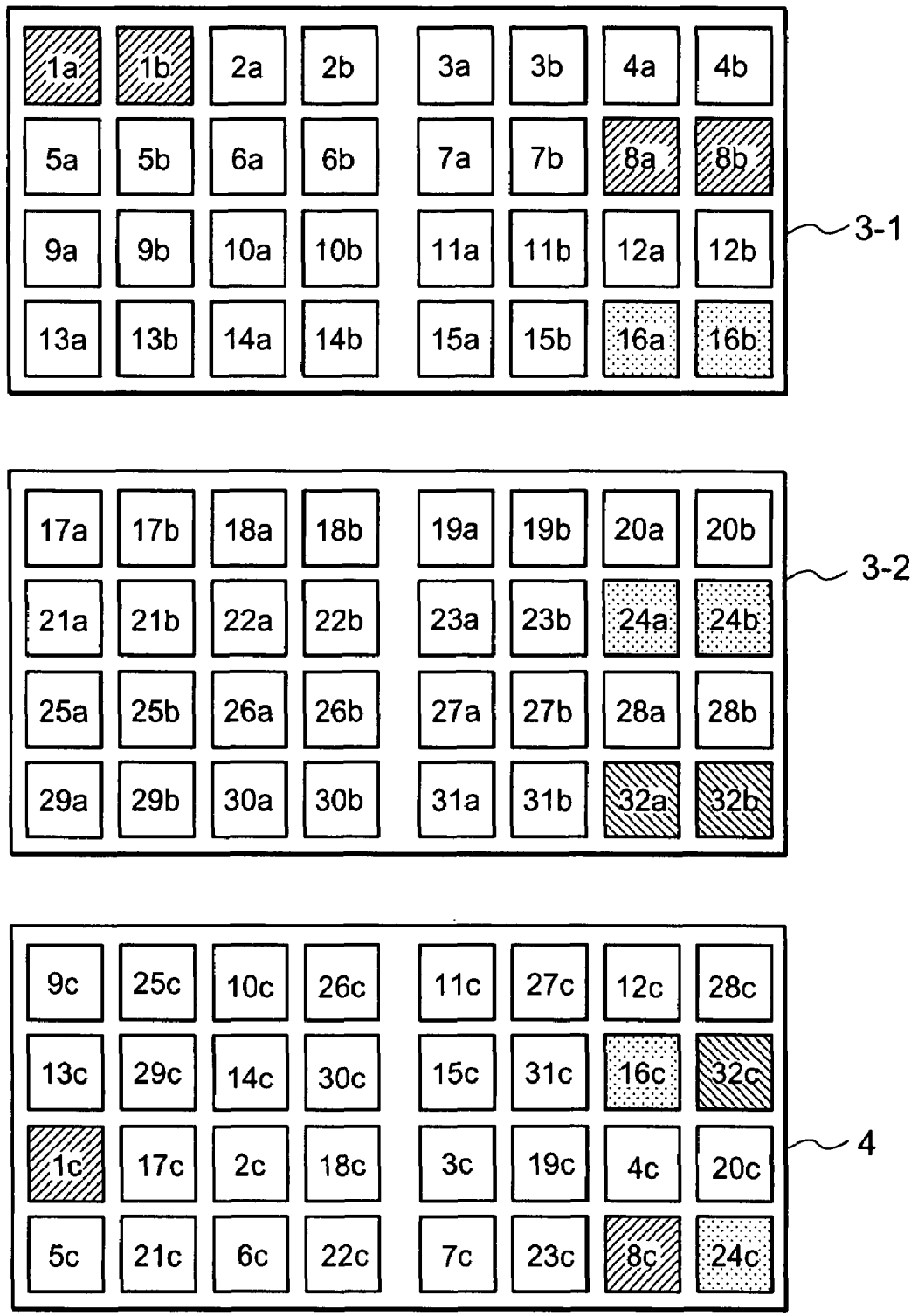
FIG. 11 is a mat arrangement diagram showing arrangement of 32-mat memory chips in a stacked memory according to the present invention, having a ratio between data bits and ECC bits of 2:1.
Figure 12A:
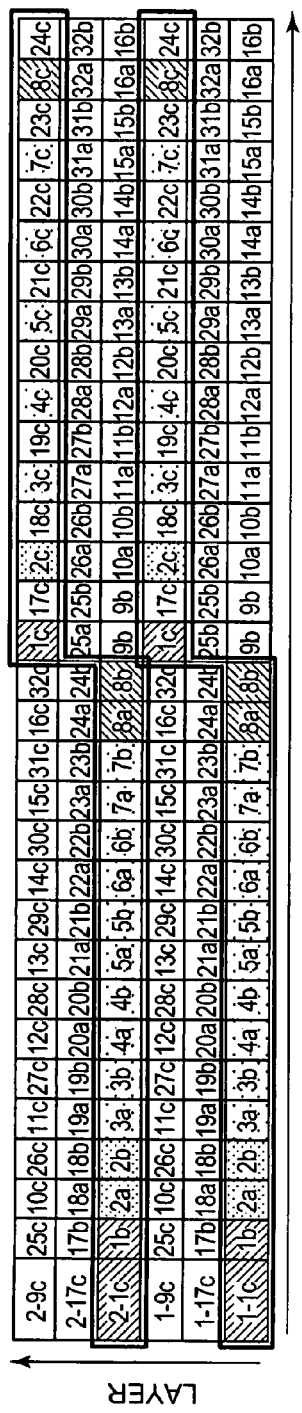
FIG. 12A is an explanatory diagram for explaining mat access according to positions of through electrodes in a stacked memory according to the present invention using 32-mat memory chips and having a ratio between data bits and ECC bits of 2:1.
Figure 12B:
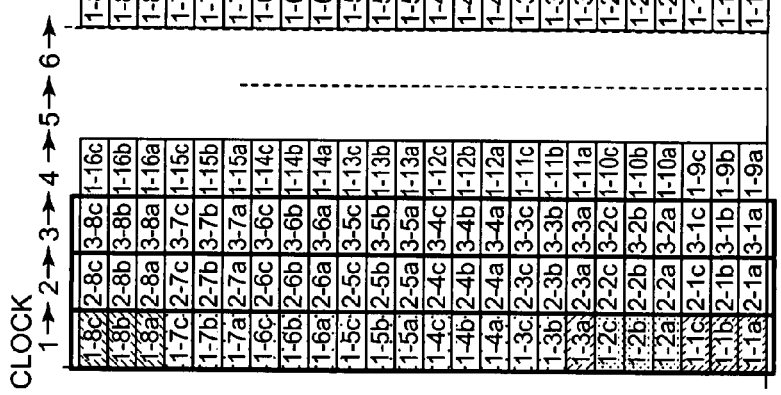
FIG. 12B a time chart of mat access according positions of through electrodes in a stacked memory according to the present invention using 32-mat memory chips and having a ratio between data bits and ECC bits of 2:1.

FIG. 7 is a configuration diagram of a memory system using stacked memories. FIG. 8 is a layout diagram of memory chips. FIG. 9 is a mat arrangement diagram of a stacked memory using 16-mat memory chips. FIG. 10A is an explanatory diagram for explaining mat access according to positions of through electrodes in the stacked memory shown in FIG. 9, and FIG. 10B is a time chart for explaining mat access according to positions of through electrodes in the stacked memory shown in FIG. 9. FIG. 11 is a mat arrangement diagram of a stacked memory using 32-mat memory chips. FIG. 12A is an explanatory diagram for explaining mat access according to positions of through electrodes in the stacked memory shown in FIG. 11, and FIG. 12B is a time chart for explaining mat access according to positions of through electrodes in the stacked memory shown in FIG. 11.

A stacked memory according to the present invention is configured such that a ratio between data bits and ECC bits, a ratio between a quantity of data layers and a quantity of ECC layers, and a ratio between a quantity of activated mats for data and a quantity of activated mats for ECC are equal to each other. A quantity of mats in each memory chip used in the stacked memory is greater than a quantity of layers to be stacked. This means that the quantities of layers and activated mats are determined according to a ratio between data bits and ECC bits. All the memory chips stacked have same configuration, and each memory chip has a register and a function of controlling mats individually. Since each memory chip has a control system for each mat, the stacked memory is capable of individually designating a control for the layers and mats thereof. For example, in the memory chip in a data layer, a quantity of activated mats is set by the register. The memory chip in the ECC layer converts an address so that the positions of through electrodes of ECC bits and data bits are changed to those mats at non-competing positions. Data bits and ECC bits are input/output via the through electrodes of the mats at the non-competing positions.

Each memory chip has a register for designating its operation mode. Stacked memory chips are allocated as data layers or ECC layers according to their layer addresses, and an operation mode is set in the register of each memory chip. For example, a quantity of mats operating simultaneously is set in the registers in the data layers. In order to operate a plurality of mats simultaneously, a part of bits in a mat address is set to "Don't Care". Address converting information is set in the register in the ECC layer. The address converting is information for converting an address to an address of a mat which is different in physical position from operating mats of the data layers. In order to change the mat, the mat address designating an area of the data mat is inverted in the address converting information.

Herein, description will be made of a method for selecting a layer in a stacked memory. When all the stacked memory chips have same configuration, all the memory chips receive a common address. Therefore, all the memory chips are selected simultaneously. Although having same configuration, layers can be individually selected and activated with a layer address input externally by layer selection methods as described below, for example. These layer selection methods are described in Japanese Patent Application NO. 2005-136659 (US 2006-267212 A1) filed by the present inventor. The methods will be described briefly below.

The layer selection methods include a method of spirally connecting the through electrodes for layer addresses. The description herein will be made of a layer selection method regarding to ten layers in total as shown in FIG. 3A, consisting of eight data layers 3 and two ECC layers 4. Each of the memory chips has commonly ten through electrodes for layer addresses A0 to A9. The through electrode of A0 among these layer addresses corresponds to a chip selection signal. The memory chips are connected spirally so that the position of each through electrode at the layer address is different from the position of a bump in the top face of the chip from which the signal is led out. For example, the position of the bump for the through electrode at the address A0 is the position of the through electrode at the address A1. Likewise, the memory chips are connected so as to establish positional relationship between the input through electrodes and the outputting bumps of A1→A2, A2→A3, . . . , and A9→A0.

When the memory chips spirally connected in this manner are stacked, different layer address are input to the through electrodes at the address A0 of the respective memory chips. The addresses input to the through electrode at A0 are A0, A9, A8, . . . , A2, A1 in the direction from the bottom to the top of the stacked memory chips. If A0 and A2 are selected as the layer addresses for example, the lowermost layer and the second uppermost layer can be selected. In this manner, even if the memory chips having same configuration are stacked, the layers can be activated individually with common layer addresses. Although the description has been made with regard to the layer selection method using spiral connection, other methods may be equally used so far as the layers of the stacked memory chips having same configuration can be activated individually with common layer addresses.

FIG. 3A is a configuration diagram showing a stacked memory comprised of ten layers of stacked memory chips 2 having through electrodes. The ten layers of stacked memory chips 2 are consisting of eight layers of memory chips 2 forming data layers 3 and two layers of memory chips 2 forming ECC layers 4. Four data layers 3 and one ECC layer 4 are grouped into one set, so that the sets of layers thus formed operate separately. The data layer 3 and the ECC layer 4 operate a plurality of mats simultaneously according to the ratio between data bits and ECC bits. The data layer 3 operates a plurality of mats by the register. The ECC layer 4 operates mats at different positions from those of the data layer by converting the input address by the register. These mats operable simultaneously are allocated such that their physical positions in the memory chips differ from each other. The allocation of the mats at different physical positions enables data in the mats to be input and output without competition by separate through electrode.

FIG. 3B is a mat arrangement diagram showing arrangement of mats in memory chips.

Quantities of mats currently typically used are two's powers, namely 8 ($2^3$), 16 ($2^4$), and 32 ($2^5$). These mats individually have a control system so that their operation is controlled individually. Description will be made of configuration of a stacked memory using such memory chips.

FIG. 4 is diagram showing arrangement of mats in a stacked memory using eight-mat memory chips.

A stacked memory having a ratio between data bits and ECC bits of 8:1 requires nine or more mats in each memory chip. Therefore, such a stacked memory cannot be formed by using eight-mat memory chips. The use of eight-mat memory chips can form a stacked memory having a ratio between data bits and ECC bits of 4:1 or 2:1. A stacked memory including ECC bits shown in FIG. 4A has a ratio between data bits and ECC bits of 4:1. According to the condition that a ratio between data bits and ECC bits is equal to a ratio between a quantity of data layers and a quantity of ECC layers, four data layers 3: 3-1 comprised of mats 1a, 1b, 1c, 1d, 2a, 2b, 2c, and 2d; 3-2 comprised of mats 3a, 3b, 3c, 3d, 4a, 4b, 4c, and 4d; 3-3 comprised of mats 5a, 5b, 5c, 5d, 6a, 6b, 6c, and 6d; 3-4 comprised of mats 7a, 7b, 7c, 7d, 8a, 8b, 8c, and 8d and one ECC layer 4 (comprised of 2e, 4e, 6e, 8e, 1e, 3e, 5e, and 7e) are stacked. It is obvious that eight data layers and two ECC layers may be stacked. In this case, the stacked memory is divided into two groups operating separately, each consisting of four data layers and one ECC layer.

The memory chips (3-1, 3-2, 3-3, 3-4, 4) are allocated with layer addresses so that a layer corresponding to the input address is selected. The layer address for the ECC layer 4 is set such that the ECC layer 4 always operates whenever the stacked memory is accessed. According to the condition that a ratio between data bits and ECC bits is equal to a ratio between a quantity of activated mats for data and a quantity of activated mats for ECC, the quantity of activated mats for data is four. The quantity of activated mats is set to four in the register in the memory chips of the data layer 3. Since an address applied to the mats is interpreted by the data layer as a common address to the four mats, two bits of the address is set to "Don't Care". In the ECC layer, in contrast, these two bits of the address are interpreted directly to designate one mat.

Address converting information is set in the register of the ECC layer 4. In order to avoid bus competition with the mats for data, the bit designating an area including four mats for data is inverted to activate the mats for ECC bits. For example, the data layer 3-1 is composed of eight mats, and the mat address has three bits of 000 to 111. The addresses of the activated mats (1a, 1b, 1c, 1d) of the data layer are for example 000 to 011. The most significant bit "0" that is common to all theses mat addresses is a mat address bit designating the area. It is made possible by inverting the mat address bit designating the area to designate mats at different positions from the mats for data.

It is assumed that an address is designated by an access to the stacked memory and a bank 1 is accessed, for example. The four mats (1a, 1b, 1c, 1d) in the first data layer 3-1 are activated as data layer activated mats 3'. At the same time, the fifth layer converts, as an ECC layer, the address based on information in the register or the like. One mat 1e in the ECC layer 4 is activated as an ECC layer activated mat 4'. Herein, the data mats and ECC mat which are simultaneously activated to input/output data shall be generally referred to as the "bank".

The positions of the data layer activated mats 3' and the position of the ECC layer activated mat 4' are designated so that their through electrodes do not compete with each other. It is made possible, by differing the physical positions of the mats, to input/output data bits corresponding to four mats and ECC bits corresponding to one mat in response to an access to the bank 1. In this manner, the four mats with suffixes of a, b, c and d as data mats and the one mat with a suffix of e as an ECC mat operate simultaneously to form one bank. In the stacked memory shown in FIG. 4A, eight banks 1 to 8 operate as memories with ECC bits.

Figure 4A:
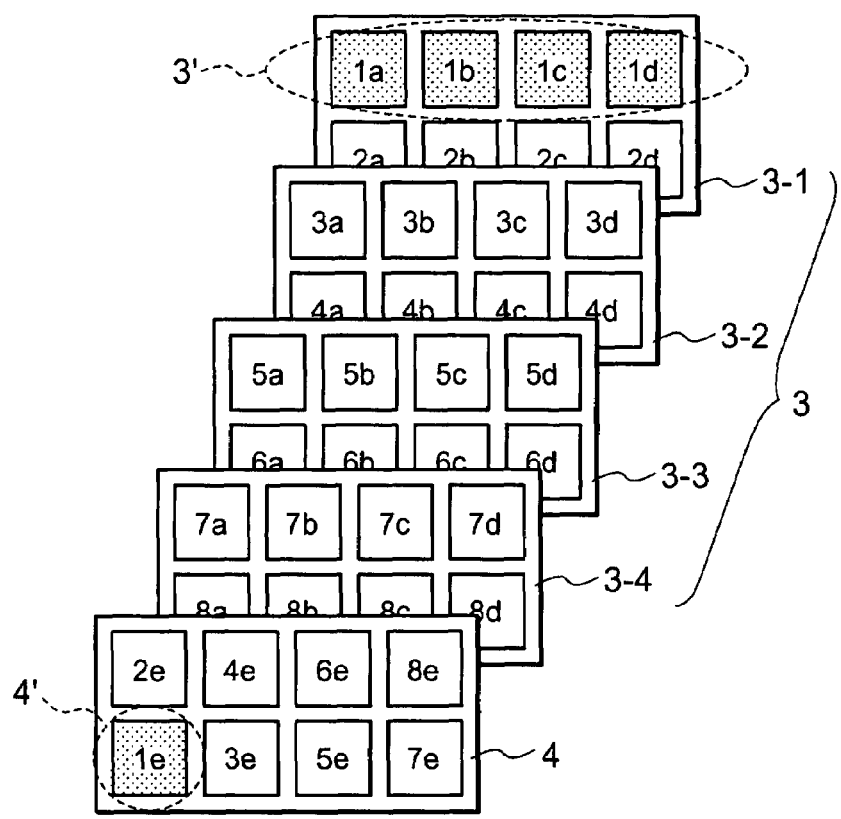
FIG. 4A is a mat arrangement diagram showing arrangement of eight-mat memory chips in a stacked memory according to the present invention, having a ratio between data bits and ECC bits of 4:1.
Figure 4B:
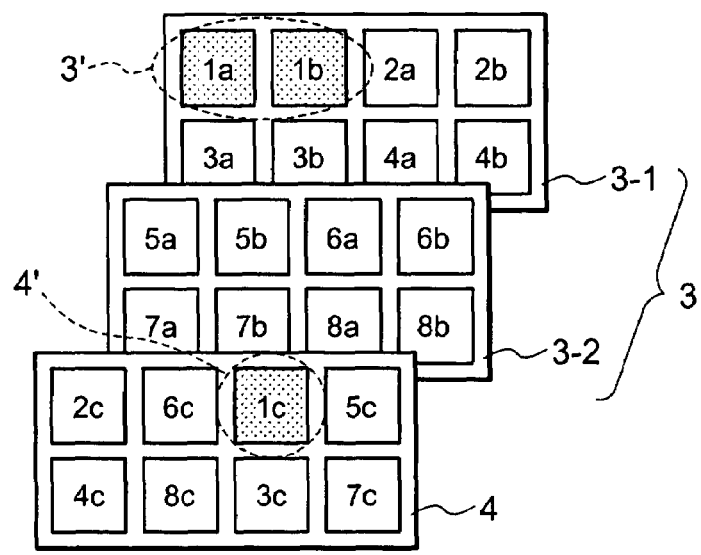
FIG. 4B is a mat arrangement diagram showing arrangement of eight-mat memory chips in a stacked memory according to the present invention, having a ratio between data bits and ECC bits of 2:1.

FIG. 4B shows a stacked memory having a ratio between data bits and ECC bits of 2:1.

The stacked memory is comprised of two data layers 3: 3-1 comprised of mats 1a, 1b, 1c, 2a, 2b, 3a, 3b, 4a, and 4b; 3-2 comprised of mats 5a, 5b, 6a, 6b, 7a, 7b, 8a, and 8b and one ECC layer 4 (comprised of mats 2c, 6c, 1c, 5c, 4c, 8c, 3c, and 7c). For example, two mats (1a, 1b) in the data layer 3 are activated as data layer activated mats 3', and a mat (1c) in the ECC layer 4 is activated as an ECC layer activated mat 4'. The mat 1c of the ECC layer is located at a different physical position in the memory chip from those of the two mats of the data layer.

A quantity of the activated mats is set to two in a register in the memory chip of the data layer 3. Since an address applied to the mats is interpreted by the data layer as a common address to the two mats, one bit of the address is set to "Don't Care". In the ECC layer, in contrast, this one bit of the address is interpreted directly to designate one mat. Address converting information is set in a mode register of the ECC layer 4. In order to avoid bus competition with the mats for data, the bits designating an area of the two mats for data are inverted to activate the mat for ECC bit. Other aspects of configuration and operation are the same as in the case in which the ratio between data bits and ECC bits is 4:1. Therefore, detailed description thereof will be omitted.

When formed by using eight-mat memory chips, the stacked memory can be formed to have a ratio between data bits and ECC bits of 4:1 or 2:1. The ECC layer converts its mat address to differentiate the physical position of the ECC layer activated mat 4' from that of the data layer activated mat 3'. Therefore, data of the memory chips (including ECC) is input/output via different through electrodes for the respective banks. Such data is rearranged into a data row and ECC row by a hub to be described later. In this manner, a stacked memory having ECC bits can be formed.

Figure 5A:
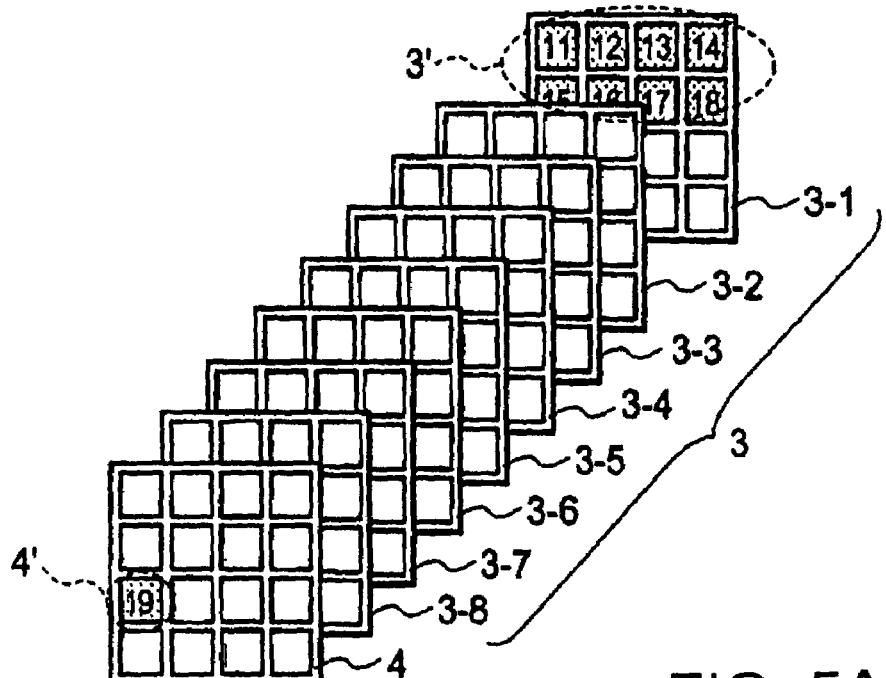
FIG. 5A is a mat arrangement diagram showing arrangement of 16-mat memory chips in a stacked memory according to the present invention, having a ratio between data bits and ECC bits of 8:1.
Figure 5B:
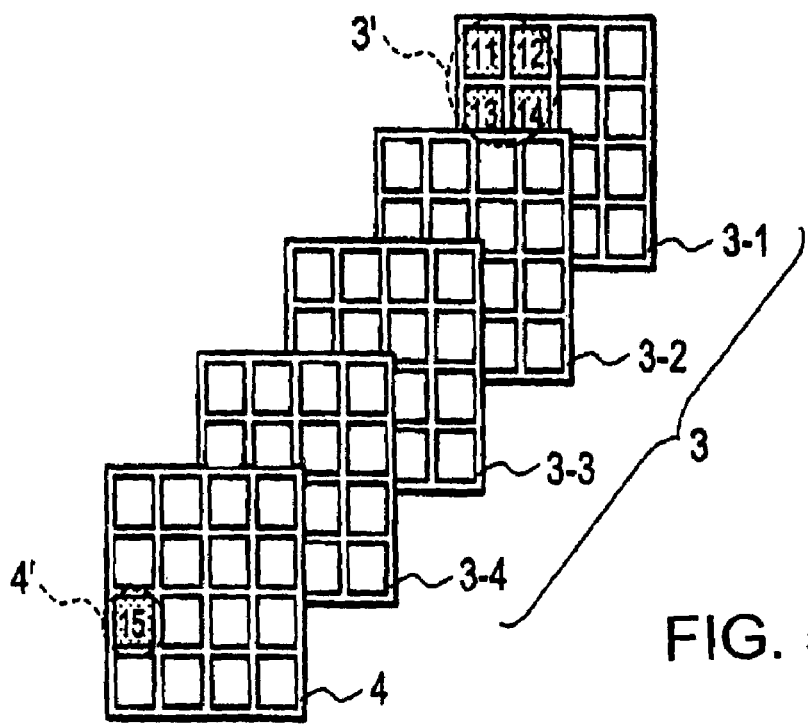
FIG. 5B is a mat arrangement diagram showing arrangement of 16-mat memory chips in a stacked memory according to the present invention, having a ratio between data bits and ECC bits of 4:1.
Figure 6:
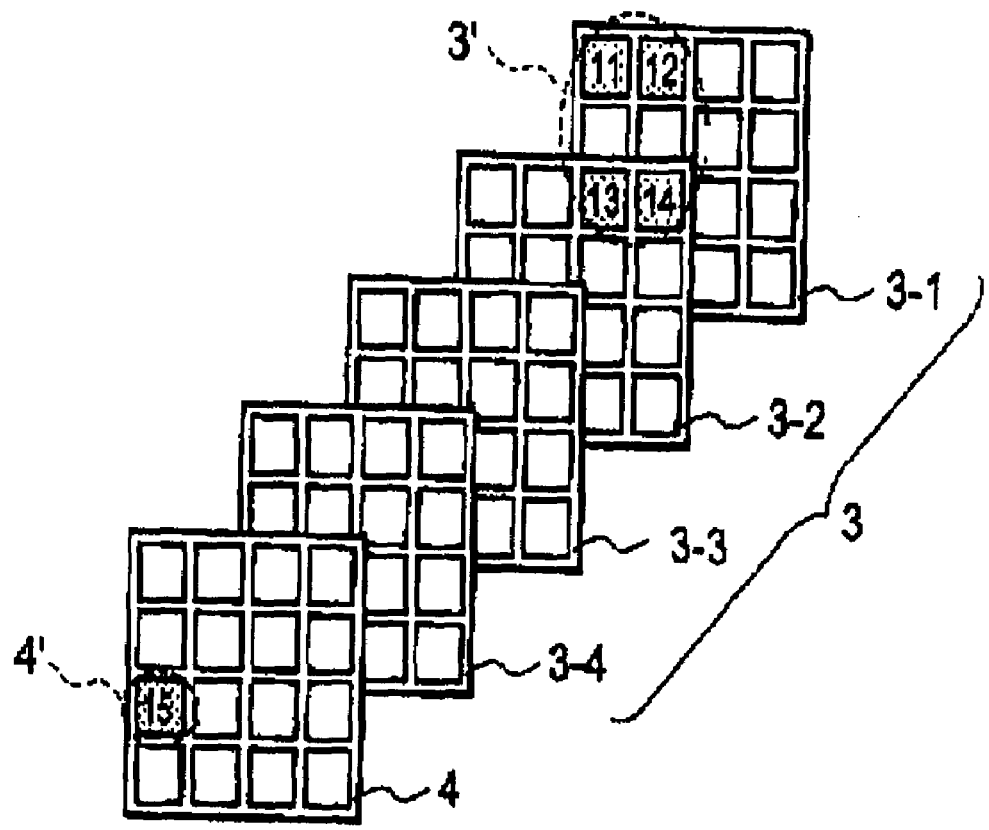
FIG. 6 is a mat arrangement diagram showing another arrangement of eight-mat memory chips in a stacked memory according to the present invention, having a ratio between data bits and ECC bits of 4:1.

FIG. 5 is a mat arrangement diagram showing a stacked memory using 16-mat memory chips. Using 16-mat memory chips, a stacked memory can be formed to have a ratio between data bits and ECC bits of 8:1, 4:1, or 2:1. FIG. 5A shows a case in which the ratio between data bits and ECC bits is 8:1, and FIG. 5B shows a case in which the ratio between data bits and ECC bits is 4:1.

The stacked memory shown in FIG. 5A is comprised of eight data layers 3 (3-1 to 3-8) and one ECC layer 4. In the illustration shown in FIG. 5A, a bank 1 is accessed so that eight mats 11 to 18 are activated as data layer activated mats 3', and one mat 19 is activated as an ECC layer activated mat 4'. The mat 19 in the ECC layer is located at a different physical position in the memory chip from those of the eight mats in the data layer 3, so that their through electrodes will not compete with each other. The quantity of activated mats is set to eight in the register of the data layer 3. Therefore, three bits in the mat address are set to "Don't Care", and the eight mats are operated simultaneously. Address converting information is set in the register of the ECC layer 4. In order to avoid bus competition with the mats for data, the bit designating an area of the eight mats for data is inverted to activate the mat for ECC bit.

The stacked memory shown in FIG. 5B is comprised of four data layers 3 (3-1 to 3-4) and one ECC layer 4. In the illustration shown in FIG. 5B, a bank 1 is accessed so that four mats 11 to 14 are activated as data layer activated mats 3', and one mat 15 is activated as an ECC layer activated mat 4'. The mat 15 in the ECC layer is located at a different physical position in the memory chip from those of the four mats in the data layer 3, so that their through electrodes will not compete with each other. In this case, the quantity of activated mats is set to four in the register of the data layer 3. Therefore, two bits in the mat address are set to "Don't Care", and the four mats are operated simultaneously. Address converting information is set in the register of the ECC layer 4. In order to avoid bus competition with the mats for data, the bits designating an area of the four mats for data are inverted to activate the mat for ECC bit. A stacked memory having a ratio between data bits and ECC bits of 2:1 can be configured in the same manner, and accordingly, the description thereof will be omitted.

When formed by using 16-mat memory chips, the stacked memory can be formed to have data bits and ECC bits at any of the ratios 8:1, 4:1 and 2:1. The ECC layer converts its mat address to differentiate the physical position of the ECC layer activated mat 4' from those of the data layer activated mats 3'. Therefore, data of the memory chips (including ECC) is input/output via different through electrodes for the respective banks. Such data is rearranged into a data row and ECC row by a hub to be described later. In this manner, a stacked memory having ECC bits can be formed.

FIG. 6 shows another configuration example of a stacked memory using 16-mat memory chips. In this configuration example, data layer activated mats 3' are allocated to mats in a plurality of data layers (3-1 and 3-2) to form one bank.

FIG. 6 shows mat arrangement in a stacked memory having a ratio between data bits and ECC bits of 4:1. Although 16-mat memory chips are used in this example, the quantity of mats is not limited to 16. Memory chips having other quantities of mats may be used to form a stacked memory while allocating data mats to a plurality of data layers.

The stacked memory shown in FIG. 6 is comprised of four data layers 3 (3-1 to 3-4) and one ECC layer 4. As shown in FIG. 6, four mats 11 to 14 are activated as data layer activated mats 3' and one mat 15 is activated as an ECC layer activated mat 4'. However, among the four data layer activated mats, the mats 11 and 12 are arranged in the data layer 3-1 and the mats 13 and 14 are arranged in the data layer 3-2. In this case as well, the mats are arranged such that the through electrodes of the mats do not compete with each other.

Further, the mat 15 in the ECC layer is located at a different physical position in the memory chip from those of the four mats in the data layer 3, so that their through electrodes will not compete with each other. In this example, address converting information is set in the registers of the data layers 3 to operate the four mats simultaneously. Address converting information is set in the register of the ECC layer 4 to avoid bus competition with the mats for data. When the data layer activated mats are distributed to a plurality of data layers 3 in this manner, the power consumption is dispersed, and the heat distribution can be made uniform in the stacked memory.

Subsequently, description will be made of a memory system having a plurality of stacked memories as described above. FIG. 7 shows a memory system 13 having a plurality of memory blocks 12 mounted on a system board 7. Each memory block 12 is comprised of a stacked memory 11 having a plurality of stacked memory chips 2, an interposer 5, and a hub 6. The interposer 5 connects between the stacked memory 11 and the hub 6. The hub 6 is a memory control chip, which receives a control signal (such as a clock, command, or address) from the outside and receives/outputs data. The hub 6 controls operation of the layers and mats in the stacked memory 11 based on the input control signal. The hub 6 receives and outputs data of the stacked memory via a through electrode. The data exchanged between the stacked memory 11 and the hub 6 is arranged as a data row and ECC row by the hub 6, and exchanged between the hub 6 and an external system.

FIG. 8 shows an example of layout of a memory chip 2 corresponding to FIG. 7.

The memory chip 2 has a memory capacity of 1 Gbits and is composed of 16 mats. The capacity per mat is 64 Mbits and the quantity of data bits (DQ) per mat is 32. The memory chip 2 has an individual command address control system (C/A ctrl) for each mat and is capable of controlling operation of the mats individually. This means that the memory chip 2 defines a unit that receives a control signal from the hub 6 to individually designate control for the layers and mats, and is capable of simultaneously operating them. The memory chip 2 further has a register (not shown), in which the operation mode as the data layer or the ECC layer is set.

FIGS. 9 and 10 respectively show a mat arrangement diagram and an example of operation of a stacked memory formed by using the memory chips shown in FIG. 8 and having a ratio between data bits and ECC bits of 2:1.

The stacked memory shown in FIG. 9 is comprised of two memory chips as data layers 3 (3-1, 3-2) and one memory chip as an ECC layer 4. FIG. 10A is an explanatory diagram showing mat access as an example of operation. FIG. 10B is a time chart for explaining the example of operation.

The stacked memory shown in FIG. 9 is comprised of two memory chips as data layers 3: 3-1 comprised of mats 1a, 1b, 2a, 2b, 3a, 3b, 4a, 4b, 5a, 5b, 6a, 6b, 7a, 7b, 8a, and 8b; 3-2 comprised of mats 9a, 9b, 10a, 10b, 11a, 11b, 12a, 12b, 13a, 13b, 14a, 14b, 15a, 15b, 16a, and 16b and one memory chip as an ECC layer 4 (comprised of mats 5c, 13c, 6c, 14c, 7c, 15c, 8c, 16c, 1c, 9c, 2c, 10c, 3c, 11c, 4c, 12c. FIG. 10A is an explanatory diagram showing mat access as an example of operation. FIG. 10B is a time chart for explaining the example of operation. simultaneously, the quantity of banks capable of simultaneous operation is four. For example, the banks 1 to 4 are operable simultaneously. It is also possible to increase the quantity of stacked memory chips to six layers and 32 banks (four data layers and two ECC layers), or 9 layers and 48 banks (six data layers and three ECC layers). However, even if the quantity of stacked memory chips is increased, the quantity of banks operable simultaneously remains four since only the banks located at positions where their through electrodes do not compete with each other are able to operate simultaneously.

FIG. 10 shows an example of operation of these stacked memories. FIG. 10A is an explanatory diagram for explaining mat access according to through electrode positions, while FIG. 10B is a time chart thereof.

FIG. 10 shows a stacked memory composed of nine layers and 48 banks (six data layers and three ECC layers). In the stacked memory shown here, a minimum command period tRC from one command to the subsequent command is 45 ns. Therefore, 12 accesses are required for this tRC (45 ns) if a clock is 4 ns. In FIG. 10A, the through electrode positions are indicated in the horizontal (X) direction and the memory chip layers are indicated in the vertical (Y) direction. In this example, two data layers and one ECC layer are grouped into one set, and a total of nine layers in three sets are stacked. These three sets of layers operate separately.

For an example of access to these sets of layers, four banks (1-1 to 1-4) in the first set are accessed with a first clock, four banks (2-1 to 2-4) in the second set are accessed with a second clock, and four banks (3-1 to 3-4) in the third set are accessed with a third clock. Subsequently, four banks (1-5 to 1-8) in the first set are accessed with a fourth clock, four banks (2-5 to 2-8) in the second set are accessed with a fifth clock, and four banks (3-5 to 3-8) in the third set are accessed with a sixth clock. These access procedures are repeated sequentially until four banks (3-13 to 3-16) in the third set are accessed with a twelfth clock. In this manner, all the 48 banks in the nine layers are accessed in 12 cycles. If the stacked memory is formed by only the first set consisting of two data layers and one ECC layer, only four cycles of the 12 cycles are used. In order to utilize the tRC to its maximum, it is preferable to stack a plurality of sets of layers.

A mat arrangement diagram and an example of operation of a stacked memory using 32-mat memory chips and having a ratio between data bits and ECC bits of 2:1 are shown in FIG. 11 and FIG. 12, respectively. FIG. 11 is a mat arrangement diagram of the stacked memory. FIG. 12A is an explanatory diagram for explaining mat access according to through electrode positions, and FIG. 12B is a time chart thereof.

The stacked memory shown in FIG. 11 is composed of three layers and 32 banks, specifically, two memory chips 3-1,3-2 as data layers 3 and one memory chip as an ECC layer 4. When the quantity of data bits in each mat is 32, the stacked memory is capable of receiving/outputting 96 bits (32×2+32) of data, and eight banks are operable simultaneously.

For example, mats 1a and 1b of the data layer 3-1 and a mat 1c of the ECC layer 4 together form one bank. In total, 32 banks are formed. However, since only the banks located at positions where their through electrodes do not compete with each other are allowed to operate simultaneously, the quantity of banks capable of simultaneous operation is eight. It is also possible to increase the quantity of stacked memory chips to six layers and 64 banks (four data layers and two ECC layers), or nine layers and 96 banks (six data layers and three ECC layers). However, even if the quantity of stacked memory chips is increased, the quantity of banks operable simultaneously remains eight since only the banks located at positions where their through electrodes do not compete with other are able to operate simultaneously.

FIG. 12 illustrates an example of operation of these stacked memories. FIG. 12A is an explanatory diagram for explaining mat access according to through electrode positions, and FIG. 12B is a time chart thereof. While in FIG. 12A only the first to sixth layers are shown with the seventh to ninth layers being omitted, the stacked memory has nine layers and 96 banks (six data layers and three ECC layers). The nine layers are grouped into three sets each consisting of two data layers and one ECC layer. In this stacked memory, a minimum command period tRC from one command to the subsequent command is 45 ns. Therefore, six accesses are required for the tRC (45 ns) if one clock is 8 ns. In FIG. 12A, the through electrode positions are indicated in the horizontal (X) direction, and the layers of the memory chips are indicated in the vertical (Y) direction.

For an example of access to these sets of layers, eight banks (1-1 to 1-8) in the first set are accessed with a first clock. Eight banks (2-1 to 2-8) in the second set are accessed with a second clock, and eight banks (3-1 to 3-8) in the third set are accessed with a third clock. Subsequently, eight banks (1-9 to 1-16) in the first set are accessed with a fourth clock, eight banks (2-9 to 2-16) in the second set are accessed with a fifth clock, and eight banks (3-9 to 3-16) in the third set are accessed with a sixth clock. In this manner, a half of the 48 banks of the nine layers can be accessed. When the stacked memory is composed of six or nine layers, access is enabled to the bank that is accessed first after one cycle of tRC without scanning all the banks. If a method is selected to scan all the banks, all the banks can be accessed by eight accesses (64 ns) in the case of six layers, and by 12 accesses (96 ns) in the case of nine layers. Such accessing methods can be selected arbitrarily.

The stacked memory having ECC bits according to the present invention are configured such that a ratio between data bits and ECC bits, a ratio between the quantity of data layers and the quantity of ECC layers, and a ratio between the quantity of data activated mats and the quantity of ECC activated mats are equal to each other. The quantity of mats in each memory chip used in the stacked memory is set greater than the quantity of stacked layers. This means that the quantity of layers and the quantity of activated mats are determined according to the ratio between data bits and ECC bits. The memory chips used in the stacked memory have a register and a function to individually designate control for each of the mats.

A quantity of data layer activated mats is designated for the memory chip of each data layer by means of the register thereof. A layer designated as an ECC layer by an address converts the address to change the positions of the ECC layer activated mats and data layer activated mats to the positions where they do not compete with each other. Such operation of the layers and the mats in the stacked memory is controlled individually. According to the configuration of the present invention, the stacked memory can be formed to establish any desired ratio between the quantity of data bits and the quantity of ECC bits by using memory chips having same configuration. A stacked memory having ECC bits can be obtained by stacking the memory chips according to the present invention.

Although the present invention has been specifically described on the basis of preferred embodiments, it should be understood that the present invention is not limited to these embodiments. Various modifications and variations are possible without departing from the scope of the invention, and all these modifications and variation obviously fall within the scope of the present invention.

What is claimed is:

1. A stacked memory formed by stacking memory chips having through electrodes, wherein:
    a first ratio between data bits and ECC bits, a second ratio between a quantity of memory chip layers for the data bits and a quantity of memory chip layers for the ECC bits, and a third ratio between a quantity of activated mats for the data bits and a quantity of activated mats for the ECC bits are set equal to each other;
    the stacked memory chips have a same chip configuration; and
    a quantity of mats of each memory chip is greater than a sum of the quantity of the memory chip layers for the data bits and the quantity of the memory chip layers for the ECC bits.

2. The stacked memory according to claim 1, wherein:
    a mat address bit designating a mat area including a plurality of mats to be activated for the data bits is inverted to be a mat address for the ECC bits so that a mat at a different position from positions of the mats activated for the data bits is designated as a mat to be activated for the ECC bits.

3. The stacked memory according to claim 2, wherein:
    a memory chip of a memory chip layer has a control system for each of the mats and the mats to operate are designated individually.

4. The stacked memory according to claim 3, wherein:
    a memory chip of a memory chip layer further comprises a register to designate an operation mode.

5. The stacked memory according to claim 4, wherein:
    a quantity of mats to be activated simultaneously is stored in the register.

6. The stacked memory according to claim 5, wherein:
    a memory of a memory chip layer chip for the data bits sets mat address bits corresponding to the quantity of the mats to be activated simultaneously to "Don't Care" by the register, and activates a plurality of mats corresponding to the quantity of the mat address bits set to "Don't Care".

7. The stacked memory according to claim 4, wherein: mat address converting information is stored in the register.

8. The stacked memory according to claim 7, wherein:
    a memory chip of a memory chip layer for the ECC bits converts a mat address by the register to select a mat having a through electrode located at a position not competing with through electrodes for the data bits, as an ECC bit mat.

9. A memory system having an interposer, a hub, and a stacked memory mounted on a system board, wherein:
    the stacked memory comprises a plurality of stacked memory chips;
    a first ratio between data bits and ECC bits, a second ratio between a quantity of memory chip layers for the data bits and a quantity of memory chip layers for the ECC bits, and a third ratio between a quantity of activated mats for the data bits and a quantity of activated mats for the ECC bits are set equal to each other; and
    a quantity of mats of each memory chip is greater than a sum of the quantity of the memory chip layers for the data bits and the quantity of the memory chip layers for the ECC bits.

10. The memory system according to claim 9, wherein:
    data exchanged between the stacked memory and the hub is arranged in a data row and ECC row which are input to and output from the hub.

11. The memory system according to claim 9, wherein: a mat address bit designating a mat area including a plurality of mats to be activated for data bits is inverted to be a mat address for the ECC bits so that a mat at a different position from positions of the mats activated for the data bits is designated as a mat to be activated for the ECC bits.

12. The memory system according to claim 9, wherein:
    a memory chip of a memory chip layer has a control system for each of the mats and
    the mats to operate are designated individually.

* * * * *